(12) United States Patent
Plavidal et al.

(10) Patent No.: US 11,710,647 B2
(45) Date of Patent: Jul. 25, 2023

(54) HYPERBARIC CLEAN METHOD AND APPARATUS FOR CLEANING SEMICONDUCTOR CHAMBER COMPONENTS

(71) Applicant: Applied Materials, Inc., Santa Clara, CA (US)

(72) Inventors: Richard Wells Plavidal, Ridgway, CO (US); Scott Osterman, Whitefish, MT (US); David W. Groechel, Los Altos Hills, CA (US); Gang Grant Peng, Santa Clara, CA (US); John Z. Smith, Kalispell, MT (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/161,557

(22) Filed: Jan. 28, 2021

(65) Prior Publication Data

US 2022/0238355 A1 Jul. 28, 2022

(51) Int. Cl.
*H01L 21/67* (2006.01)
*H01L 21/02* (2006.01)
*B08B 3/02* (2006.01)

(52) U.S. Cl.
CPC ........ *H01L 21/67023* (2013.01); *B08B 3/024* (2013.01); *H01L 21/02052* (2013.01); *H01L 21/67207* (2013.01)

(58) Field of Classification Search
CPC ......... H01L 21/67023; H01L 21/02052; H01L 21/67207; B08B 3/024
See application file for complete search history.

(56) References Cited

U.S. PATENT DOCUMENTS 4,795,497 A * 1/1989 McConnell ............... B08B 3/04
 134/25.4
5,122,192 A * 6/1992 Inukai ................... B05B 15/555
 134/1

(Continued)

FOREIGN PATENT DOCUMENTS

JP 11-233471 A 8/1999

OTHER PUBLICATIONS

International Search Report for PCT/US2022/014324, dated May 6, 2022.

*Primary Examiner* — Erin F Bergner
(74) *Attorney, Agent, or Firm* — Moser Taboada

(57) ABSTRACT

Embodiments of a methods and cleaning systems for cleaning components for use in substrate processing equipment are provided herein. In some embodiments, a cleaning system includes a boiler having a heater configured to heat a fluid; a clean chamber fluidly coupled to the boiler via at least one of a gas line and a liquid line, wherein the clean chamber includes one or more fixtures in an interior volume therein for holding at least one component to be cleaned, and wherein the clean chamber includes a heater for heating the interior volume; and an expansion chamber fluidly coupled to the clean chamber via a release line for evacuating the clean chamber, wherein the release line includes a release valve to selectively open or close a flow path between the expansion chamber and the clean chamber, and wherein the expansion chamber includes a chiller and a vacuum port.

15 Claims, 3 Drawing Sheets

(56) References Cited

U.S. PATENT DOCUMENTS

| | | | |
|---|---|---|---|
| 5,273,060 A * | 12/1993 | Hill, III | H01L 21/67051 |
| | | | 454/56 |
| 5,709,757 A | 1/1998 | Hatano et al. | |
| 6,354,311 B1 * | 3/2002 | Kimura | H01L 21/67034 |
| | | | 134/61 |
| 10,197,333 B2 | 2/2019 | Kim et al. | |
| 10,546,762 B2 | 1/2020 | Bergman et al. | |
| 2003/0047195 A1 * | 3/2003 | DeYoung | H01L 21/02063 |
| | | | 257/E21.228 |
| 2006/0213538 A1 * | 9/2006 | Umezawa | H01L 22/12 |
| | | | 134/113 |
| 2013/0276822 A1 | 10/2013 | Plavidal | |
| 2014/0014138 A1 * | 1/2014 | Spiegelman | B08B 3/10 |
| | | | 134/31 |
| 2014/0299162 A1 | 10/2014 | Plavidal | |
| 2018/0193885 A1 | 7/2018 | Guo et al. | |
| 2020/0055099 A1 | 2/2020 | Chen et al. | |
| 2020/0227254 A1 | 7/2020 | Delmas | |

* cited by examiner

HYPERBARIC CLEAN METHOD AND APPARATUS FOR CLEANING SEMICONDUCTOR CHAMBER COMPONENTS

FIELD

Embodiments of the present disclosure generally relate to substrate processing equipment.

BACKGROUND

Components for use in a process chamber for semiconductor substrate processing are typically cleaned prior to being installed in the process chamber. However, parts with complex geometries may be challenging to clean due to small openings and other hard to reach areas. Conventional methods of cleaning the components include sprays or agitation, which may be inadequate for cleaning parts with complex geometries and present the additional challenge of removing chemical byproducts.

Accordingly, the inventors have provided improved methods and apparatus for cleaning chamber components for use in semiconductor substrate processing equipment.

SUMMARY

Embodiments of methods and apparatus for cleaning components for use in substrate processing equipment are provided herein. In some embodiments, a cleaning system for cleaning components for use in substrate processing equipment includes: a boiler having a heater configured to heat a fluid; a clean chamber fluidly coupled to the boiler via at least one of a gas line and a liquid line, wherein the clean chamber includes one or more fixtures in an interior volume therein for holding at least one component to be cleaned, and wherein the clean chamber includes a heater for heating the interior volume; and an expansion chamber fluidly coupled to the clean chamber via a release line for evacuating the clean chamber, wherein the release line includes a release valve to selectively open or close a flow path between the expansion chamber and the clean chamber, and wherein the expansion chamber includes a chiller for cooling the expansion chamber and a vacuum port configured to couple the expansion chamber to a vacuum pump.

In some embodiments, a method of cleaning components for use in substrate processing equipment includes: loading at least one component to be cleaned into a clean chamber; heating a fluid in a boiler fluidly coupled to the clean chamber to a first temperature; delivering the heated fluid to a clean chamber to cover the at least one component with the heated fluid; increase a pressure in the clean chamber to a threshold pressure; and opening a release valve disposed in a release line that fluidly couples the clean chamber to an expansion chamber when the threshold pressure is reached to boil the fluid and evacuate the boiled fluid from the clean chamber into the expansion chamber.

In some embodiments, a non-transitory computer readable medium having instructions stored thereon that, when executed by a processor, perform a method of cleaning components for use in substrate processing equipment, the method including: loading at least one component to be cleaned into a clean chamber; heating a fluid in a boiler fluidly coupled to the clean chamber to a first temperature; delivering the heated fluid to a clean chamber to cover the at least one component with the heated fluid; increase a pressure in the clean chamber to a threshold pressure; and opening a release valve disposed in a release line that fluidly couples the clean chamber to an expansion chamber when the threshold pressure is reached to boil the fluid and evacuate the boiled fluid from the clean chamber into the expansion chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
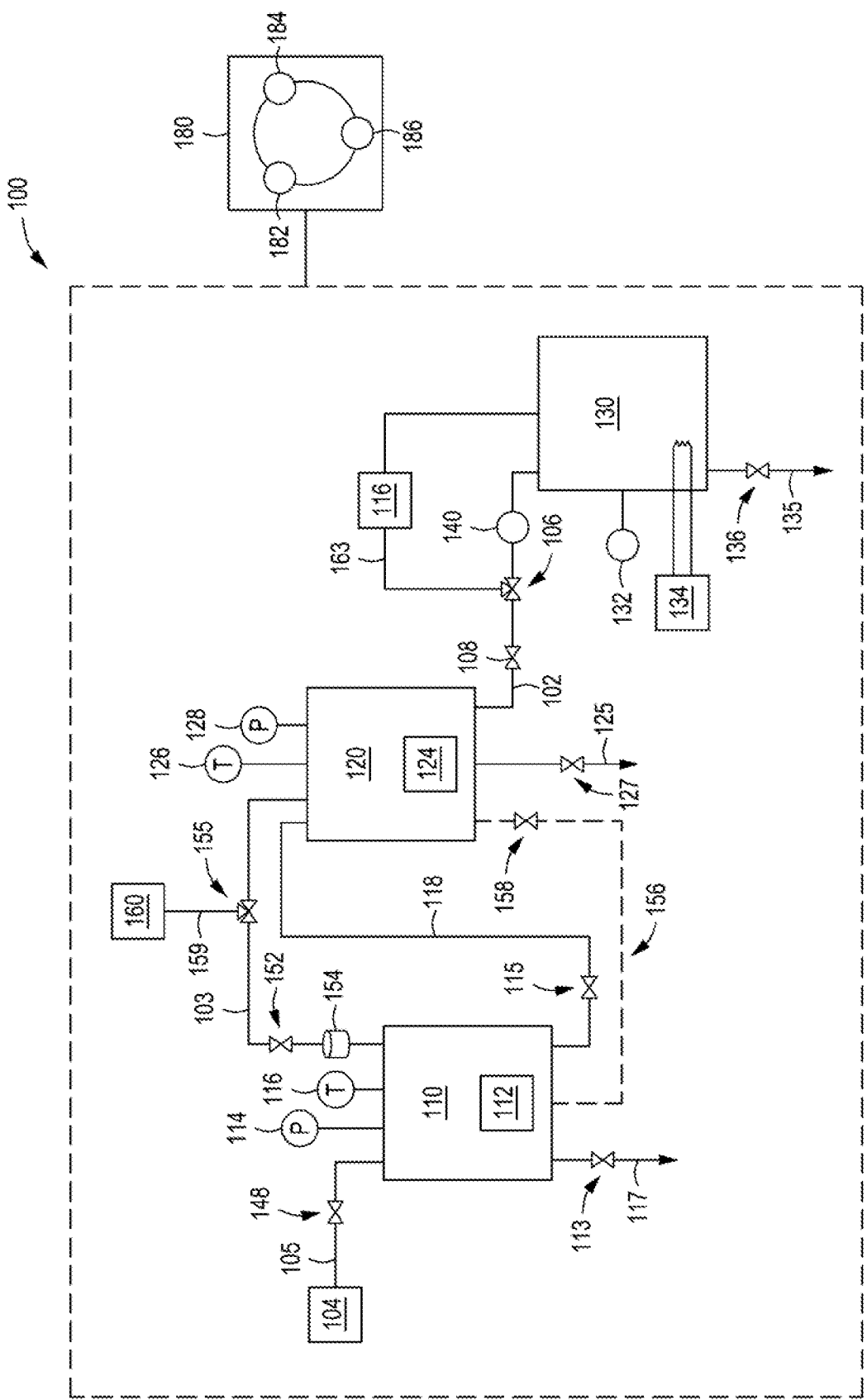
FIG. 1 depicts a schematic view of a cleaning system for cleaning components for use in substrate processing equipment in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of hyperbaric clean methods and apparatus for cleaning components for use in substrate processing equipment are provided herein. The components may be any components suitable for use in substrate processing equipment, for example, but not limited to, gas distribution plates, showerheads, process kit components, chamber liners, or the like. The components may also be any component(s) for use in substrate processing equipment that has a complex geometry, which may be difficult to clean using conventional cleaning methods.

The novel cleaning system generally includes a boiler fluidly coupled to a clean chamber, and the clean chamber fluidly coupled to an expansion chamber. A liquid is heated in the boiler to a suitable temperature. The hot steam or fluid from the boiler is introduced into the clean chamber, covering any component(s) disposed in the clean chamber with moisture. The clean chamber is pressurized to a high internal pressure. The expansion chamber is kept at a lower pressure, such as atmospheric or vacuum. When a release valve disposed between the clean chamber and the expansion chamber is opened, all of the moisture collected on the component(s) rapidly boils or cavitates due to the rapid pressure drop and evacuates from the clean chamber into the expansion chamber, along with unwanted particles or impurities on the component(s), which cleans the component(s). This process may be repeated until a desired cleanliness or desired particle count on the component is achieved.

The cleaning system provided herein advantageously controls the thermal energy by controlling the operation temperature. Further, the dynamics of the clean chamber can advantageously be controlled by adjusting the opening size of the release valve. The control of the thermal energy and dynamics of the clean chamber greatly enhance the clean process precision, efficiency, and repeatability.

FIG. 1 depicts a schematic view of a cleaning system 100 for cleaning components for use in substrate processing equipment in accordance with some embodiments of the present disclosure. The cleaning system 100 includes a boiler 110 fluidly coupled to a clean chamber 120 to deliver a fluid to the clean chamber. The cleaning system 100 includes an expansion chamber 130 fluidly coupled to the clean chamber 120 via a release line 102 to rapidly evacuate moisture and unwanted particles from the clean chamber 120.

The boiler 110 is generally a closed vessel having a heater 112 configured to heat a fluid disposed in the boiler 110. The fluid may be supplied or derived from a liquid supply 104 coupled to the boiler 110. A supply valve 148 may be disposed between the liquid supply 104 and the boiler 110 to control a flow of the liquid from the liquid supply 104 into the boiler 110. The liquid supply 104 may supply a suitable liquid such as water or deionized water. The boiler 110 may heat the liquid to generate steam. For example, the boiler 110 may heat the liquid to a temperature of about 300 degrees to about 550 degrees Fahrenheit. In some embodiments, a first temperature sensor 114 is coupled to the boiler 110 to measure a temperature inside the boiler 110. In some embodiments, a first pressure sensor 111 is coupled to the boiler 110 to measure a pressure inside the boiler 110.

In some embodiments, the boiler 110 is coupled to the clean chamber 120 via a gas line 103 to supply steam to the clean chamber 120 to saturate or cover one or more components disposed in the clean chamber 120 are to be cleaned. In some embodiments, the gas line 103 extends from an upper portion of the boiler 110 or a lid of the boiler 110. In some embodiments, the gas line 103 includes a gas line valve 152 to control a flow of gas through the gas line 103. In some embodiments, the gas line 103 includes a filter 154 configured to reduce particle contamination passing from the boiler 110, through the gas line 103, and into the clean chamber 120. In some embodiments, the filter 154 is disposed between the gas line valve 152 and the boiler 110.

The cleaning system 100 may also advantageously allow for introduction of process gasses during the cleaning process to enhance or retard material surface condition in the fully dried state. In some embodiments, the gas line 103 includes a second gas line valve 155 for mixing one or more process gases from a process gas supply 160 via a process gas supply line 159 into the gas line 103. In some embodiments, the second gas line valve 155 is a three-way valve. In some embodiments, the second gas line valve 155 is disposed downstream of the gas line valve 152. The process gas supply 160 may include one or more process gases suitable for performing a drying process, a passivation process, a seasoning process, or the like. For example, the process gas supply 160 may include one or more of nitrogen gas ($N_2$), oxygen gas ($O_2$), nitrogen trifluoride ($NF_3$), ozone ($O_3$), or ammonia ($NH_3$).

In some embodiments, a liquid line 118 extends from the boiler 110 to the clean chamber 120 to saturate or cover the one or more components disposed in the clean chamber 120 with liquid from the boiler 110. The liquid line 118 may include a liquid line valve 115 to control a liquid flow through the liquid line 118. In some embodiments, the liquid line 118 extends from a lower portion of the boiler 110. In some embodiments, the clean chamber 120 is coupled to the boiler 110 via both the gas line 105 and the liquid line 118. The boiler 110 may include a first drain line 117 coupled to a system drain (not shown) having a first drain valve 113 for draining liquid disposed in the boiler 110.

Figure 2:
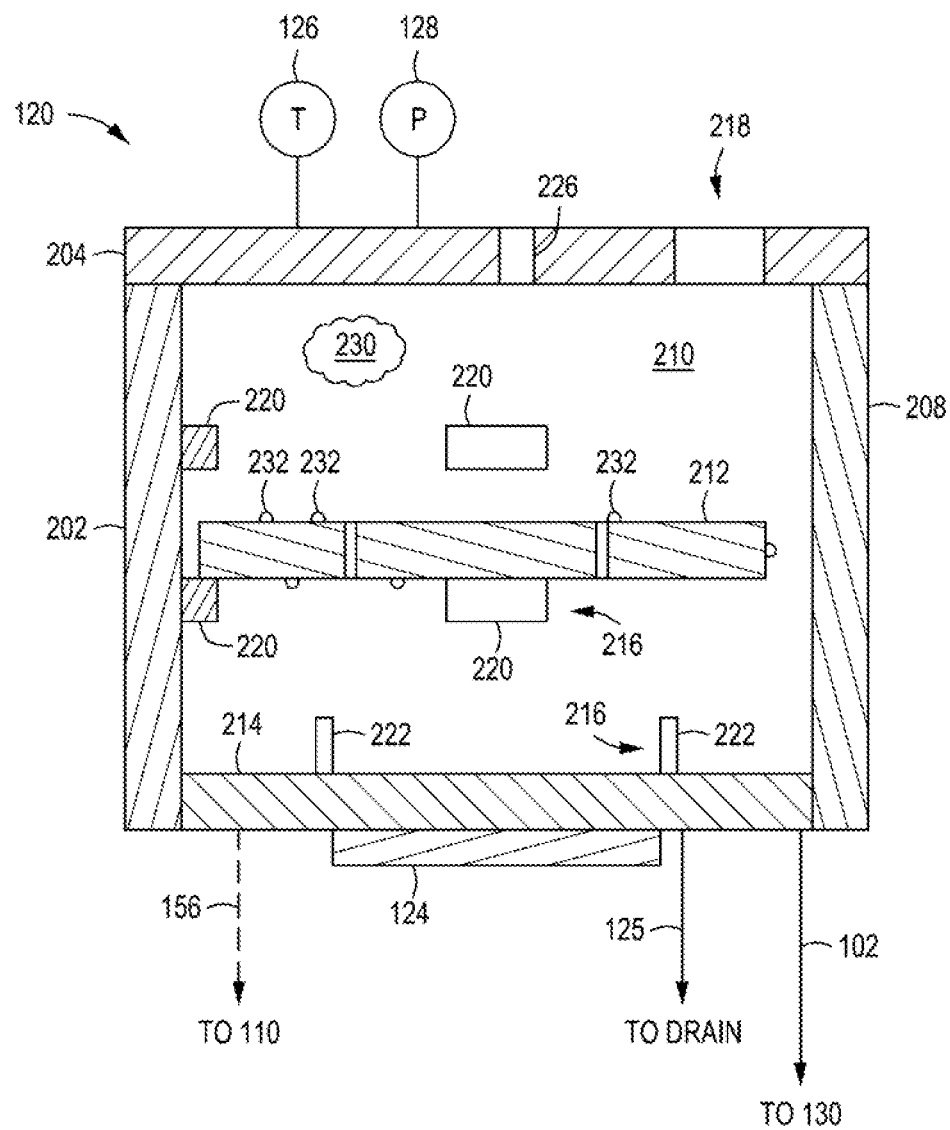
FIG. 2 depicts a schematic cross-sectional view of a clean chamber in accordance with some embodiments of the present disclosure.

The clean chamber 120 is generally a closed vessel configured to hold at least one component to be cleaned. The clean chamber 120 may be sized to accommodate at least one component 212 disposed therein. In some embodiments, the clean chamber 120 includes a heater 124 configured to heat an interior volume of the clean chamber 120. The clean chamber 120 may include a second drain line 125 coupled to a drain (not shown) having a second drain valve 127 for draining liquid disposed in the clean chamber 120. FIG. 2 depicts a simplified schematic cross-sectional view of a clean chamber in accordance with some embodiments of the present disclosure. The clean chamber 120 includes a chamber body 202 and a lid 204 coupled to the chamber body 202 to at least partially define an interior volume 210 of the clean chamber 120. The heater 124 may be disposed inside the interior volume 210, or as depicted in FIG. 2, may be disposed outside of the interior volume. The heater 124 may comprise any suitable heating element such as heater jackets, resistive heating elements, heater rods, or the like. The heater 124 is configured to maintain or increase a temperature of heated fluid 230 disposed in the clean chamber 120. In use, the heated fluid 230 in the form of steam, a heated liquid, or a combination of steam and heated liquid covers the at least one component 212 with droplets 232, or moisture. In some embodiments, a second temperature sensor 126 is coupled to the clean chamber 120 to measure a temperature inside the clean chamber 120. In some embodiments, a second pressure sensor 128 is coupled to the clean chamber 120 to measure a pressure inside the clean chamber 120.

The chamber body 202 may include a port or opening to facilitate transfer of the at least one component 212 to be cleaned into or out of the interior volume 210. In some embodiments, the clean chamber 120 includes a door 208 opposite a sidewall of the chamber body 202 configured to selectively open or close for transferring the at least one component 212 into or out of the interior volume 210. In some embodiments, the clean chamber 120 includes a viewing element 218 to observe the at least one component 212. In some embodiments, the viewing element 218 is coupled to or disposed in the lid 204. In some embodiments, the viewing element 218 is a viewport or camera. In some embodiments, the lid 204 includes a gas inlet 226 coupled to at least one of the gas line 103 or the liquid line 118. Alternatively, the lid 204 may include two gas inlets 226 coupled to the gas line 103 and the liquid line 118, respectively.

The clean chamber 120 may include a suitable support for holding or supporting the at least one component 212. In some embodiments, the suitable support may comprise one or more fixtures 216 disposed in the interior volume 210. In some embodiments, the one or more fixtures 216 may include one or more holders 222 extending from a floor 214 of the chamber body 202, where the at least one component is configured to rest on the one or more holders 222. In some embodiments, the one or more holders 222 may comprise a single support.

In some embodiments, the one or more fixtures 216 include a one or more walls supports 220 extending from sidewalls of the chamber body 202. In some embodiments, the one or more walls supports 220 comprise a plurality of wall supports that are spaced along the chamber body 202 at a common vertical height from the floor 214. In some embodiments, the one or more walls supports 220 comprise a continuous ring along the chamber body. In some embodiments, the one or more wall supports 220 may be arranged along multiple vertically spaced apart rows, where each row is configured to hold a component of the at least one component 212 (FIG. 2 depicts two vertically spaced rows). Accordingly, the one or more fixtures 216 may be configured to hold multiple components in a vertically spaced apart orientation. While the one or more fixtures 216 are depicted as one or more wall supports 220 or one or more holders 222 in FIG. 2, the clean chamber 120 may include any suitable structure, such as hooks, ledges, protrusions, or the like, for holding the at least one component 212.

Referring back to FIG. 1, a return line 156 may extend from the clean chamber 120 to the boiler 110 to recycle excess liquid from the clean chamber 120 to the boiler 110. The return line 156 may include a return line valve 158 for controlling a flow through the return line 156. In some embodiments, the return line 156 and the second drain line 125 are coupled to the floor 214 of the chamber body 202.

The release line 102 extending between the clean chamber 120 and the expansion chamber 130 facilitates evacuation of gas disposed in the interior volume 210 of the clean chamber 120. The release line 102 includes a release valve 108 to selectively open or close a flow path between the expansion chamber 130 and the clean chamber 120. In some embodiments, the release valve 108 is a control valve. In some embodiments, the release valve 108 is an on-off valve and the release line 102 further includes a flow control element 140. In some embodiments, the flow control element 140 comprises at least one of a fixed orifice, a variable orifice, or a metering valve for controlling a flow through the release line 102. In some embodiments, the flow control element 140 is disposed downstream of the release valve 108.

The expansion chamber 130 is generally a closed vessel sized to evacuate high pressure gas from the clean chamber 120. The expansion chamber 130 is configured to maintain a negative pressure with respect to the clean chamber 120 during evacuation of the clean chamber 120. The negative pressure, for example, may be maintained by increasing an internal volume of the expansion chamber 130, reducing a temperature of the expansion chamber 130, or reducing pressure of the expansion chamber 130. In some embodiments, the expansion chamber 130 has a larger internal volume than the clean chamber 120. In some embodiments, the expansion chamber 130 includes a vacuum pump 132 coupled to the expansion chamber to regulate a pressure inside the expansion chamber 130. In some embodiments, the vacuum pump 132 is configured to create vacuum pressure inside the expansion chamber 130 advantageously creating a larger pressure differential between the expansion chamber 130 and the clean chamber 120.

In some embodiments, the expansion chamber 130 is coupled to a chiller 134 configured to cool the expansion chamber 130. Cooling the expansion chamber 130 may reduce a required internal volume of the expansion chamber while maintaining the negative pressure with respect to the clean chamber 120. The chiller 134 may also advantageously cool the expansion chamber 130 after hot gas is evacuated from the clean chamber 120, decreasing cool down time between cleaning cycles on the at least one component 212 and increasing cleaning efficiency. The expansion chamber 130 may include a third drain line 135 coupled to a drain (not shown) having a third drain valve 136 for draining liquid disposed in the expansion chamber 130. In some embodiments, the first drain line 117, the second drain line 125, and the third drain line 135 are coupled downstream to a common drain.

In some embodiments, the cleaning system 100 includes a condensation particle counter (CPC) 116 disposed downstream of the clean chamber 120 and upstream of the expansion chamber 130. The CPC 116 is configured to measure a particle count from a portion of the gas that is evacuated from the clean chamber 120. In some embodiments, the CPC 116 is disposed along a bypass line 163 that extends from the release line 102 to the expansion chamber 130. In some embodiments, a three-way valve 106 disposed in line with the release line 102 may divert some flow from the release line 102 into the bypass line 163.

A controller 180 controls the operation of the cleaning system 100 using a direct control of the boiler 110, the clean chamber 120, and the expansion chamber 130, or alternatively, by controlling the computers (or controllers) associated with each of the boiler 110, the clean chamber 120, and the expansion chamber 130. In operation, the controller 180 enables data collection and feedback from the cleaning system 100 to optimize performance of the cleaning system 100. The controller 180 generally includes a Central Processing Unit (CPU) 182, a memory 184, and a support circuit 186. The CPU 182 may be any form of a general-purpose computer processor that can be used in an industrial setting. The support circuit 186 is conventionally coupled to the CPU 182 and may comprise a cache, clock circuits, input/output subsystems, power supplies, and the like. Software routines, such as a method as described below may be stored in the memory 184 and, when executed by the CPU 182, transform the CPU 182 into a specific purpose computer (controller 180). The software routines may also be stored and/or executed by a second controller (not shown) that is located remotely from the cleaning system 100.

The memory 184 is in the form of computer-readable storage media that contains instructions, when executed by the CPU 182, to facilitate the operation of the cleaning system 100. The instructions in the memory 184 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 3:
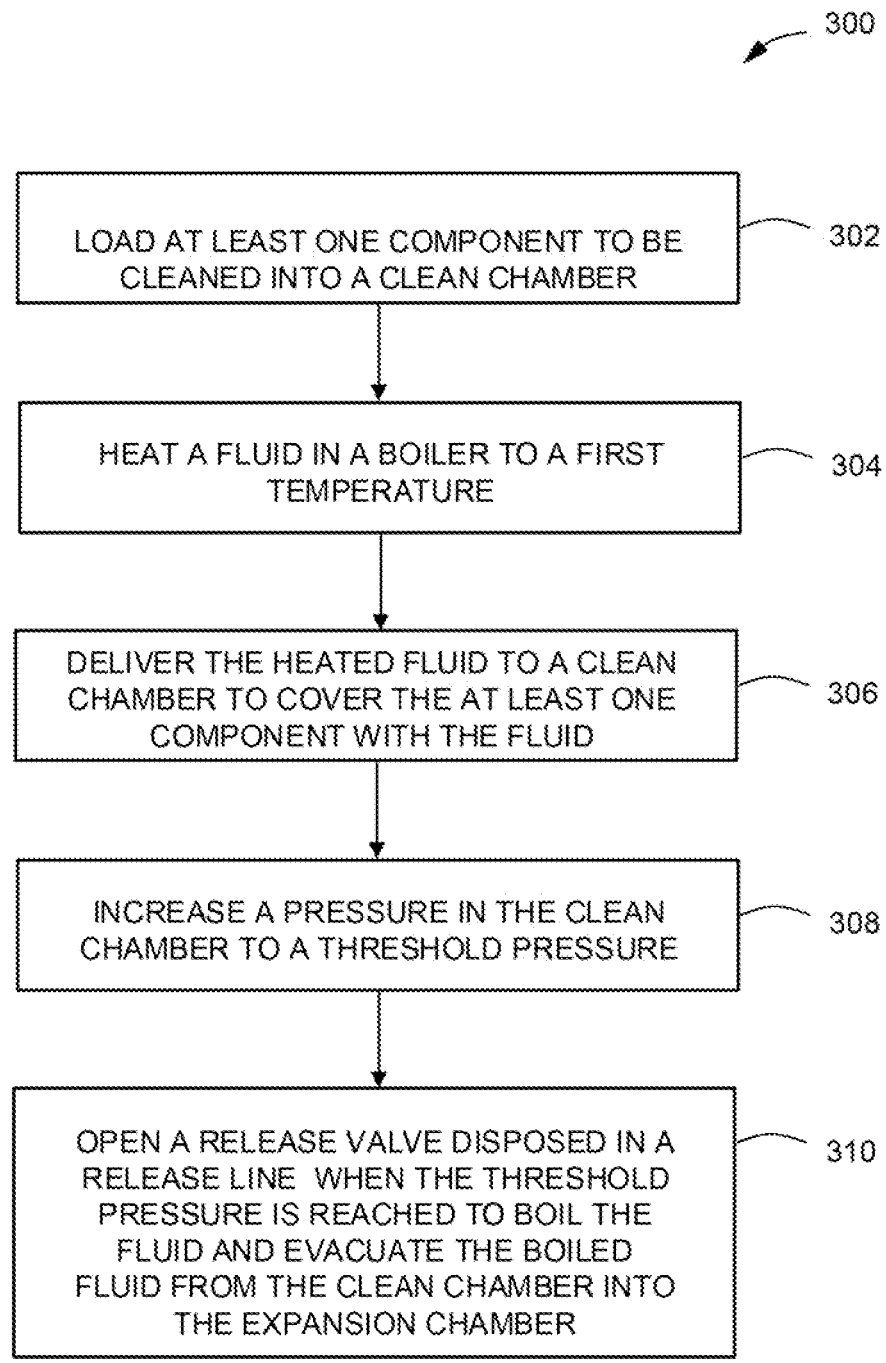
FIG. 3 depicts a flow chart of a method of cleaning components for use in substrate processing equipment in accordance with some embodiments of the present disclosure.

FIG. 3 depicts a flow chart of a method 300 of cleaning components (e.g., at least one component 212) for use in substrate processing equipment in accordance with some embodiments of the present disclosure. The substrate processing equipment may be deposition chambers, etch chambers, clean chambers, or the like. At 302, the method 300 includes loading at least one component to be cleaned into a clean chamber (e.g., clean chamber 120). The at least one component may be at least one of a gas distribution plate, a showerhead, a process kit component, a chamber liner, or the like.

At 304, the method 300 includes heating a fluid in a boiler (e.g. boiler 110) fluidly coupled to the clean chamber to a first temperature. In some embodiments, the first temperature is about 300 degrees to about 550 degrees Fahrenheit. The fluid may be delivered to the boiler via a liquid supply (e.g., liquid supply 104). The liquid may be, for example, water.

At 306, the method 300 includes delivering the heated fluid to a clean chamber to cover the at least one component with the fluid. In some embodiments, the heated fluid is delivered as a steam via a gas line valve (e.g., gas line valve 152). In some embodiments, the heated fluid is delivered as a heated liquid via a liquid line valve (e.g., liquid line valve 115). In some embodiments, once a desired amount of heated fluid is delivered to the clean chamber, at least one of the liquid line valve and the gas line valve are closed.

At 308, the method 300 includes increasing a pressure in the clean chamber to a threshold pressure. In some embodiments, the threshold pressure is about 100 to about 450 pounds per square inch (psi). In some embodiments, the pressure in the clean chamber may be increased by heating the clean chamber using a heater (e.g., heater 124).

At 310, the method 300 includes opening a release valve disposed in a release line that fluidly couples the clean chamber to an expansion chamber when the threshold pressure is reached to boil the fluid and evacuate the boiled fluid from the clean chamber into the expansion chamber. In some embodiments, the release line includes a flow control element (e.g., flow control element 140) to control a release of the pressure from the clean chamber and therefore the rate of evacuation of the boiled fluid. In some embodiments, the boiled fluid is evacuated from the clean chamber into the expansion chamber in about 5 milliseconds to about 10 seconds. In some embodiments, an internal pressure of the expansion chamber is reduced to a vacuum pressure prior to opening the release valve to create a larger pressure differential between the clean chamber and the expansion chamber.

In some embodiments, the release valve is closed after the boiled fluid is evacuated from the clean chamber. In some embodiments, the at least one component in the clean chamber is conditioned after evacuating the boiled fluid from the clean chamber. In some embodiments, conditioning the at least one component comprises performing at least one of a drying process, a passivation process, or a seasoning process by introducing suitable process gases for the desired process via a process gas supply (e.g., process gas supply 160). For example, suitable process gases may include one or more of nitrogen gas ($N_2$), oxygen gas ($O_2$), nitrogen trifluoride ($NF_3$), ozone ($O_3$), or ammonia ($NH_3$).

In some embodiments, a particle counter (e.g., CPC 116) disposed downstream of the clean chamber is used to detect a number of particles flowing therethrough. In some embodiments, at 312, the method 300 at 306, 308, and 310 is optionally repeated until desired, for example, until the number of particles detected by the particle counter is at or below a predetermined amount. That is, in some embodiments, the method 300 includes delivering additional heated fluid to the clean chamber to cover the at least one component with the additional heated fluid, increasing the pressure in the clean chamber to the threshold pressure and reopening the release valve when the threshold pressure is reached. Once the at least one component is sufficiently cleaned or processed, the at least one component may be removed from the clean chamber and installed in suitable substrate processing equipment.

While the foregoing is directed to embodiments of the present disclosure, other and further embodiments of the disclosure may be devised without departing from the basic scope thereof.

The invention claimed is:

1. A cleaning system for cleaning components for use in substrate processing equipment, comprising:
a liquid supply having a fluid disposed therein;
a boiler coupled to the liquid supply via a supply valve and having a heater configured to heat the fluid supplied to the boiler;
a clean chamber fluidly coupled to the boiler via a gas line, wherein the clean chamber includes one or more fixtures in an interior volume therein for holding at least one component to be cleaned, and wherein the clean chamber includes a heater for heating the interior volume; and
an expansion chamber fluidly coupled to the clean chamber via a release line for evacuating the clean chamber, wherein the release line includes a release valve to selectively open or close a flow path between the expansion chamber and the clean chamber, wherein a bypass line extends from the release line to the expansion chamber, and wherein the expansion chamber includes a chiller for cooling the expansion chamber and a vacuum port configured to couple the expansion chamber to a vacuum pump.

2. The cleaning system of claim 1, further comprising a process gas supply line coupled to the gas line via a three-way valve, the process gas supply line coupled to a process gas supply consisting essentially of nitrogen gas ($N_2$), oxygen gas ($O_2$), nitrogen trifluoride ($NF_3$), ozone ($O_3$), or ammonia ($NH_3$).

3. The cleaning system of claim 1, wherein the release valve is an on-off valve, and the release line further includes a metering valve for controlling a flow through the release line.

4. The cleaning system of claim 1, wherein the release valve is a control valve.

5. The cleaning system of claim 1, further comprising a condensation particle counter (CPC) disposed downstream of the clean chamber and upstream of the expansion chamber.

6. The cleaning system of claim 1, further comprising a filter disposed in the gas line between the boiler and the clean chamber and configured to reduce particle contamination from the boiler to the clean chamber.

7. The cleaning system of claim 1, further comprising a liquid line that extends from the boiler to the clean chamber, and a return line that extends from the clean chamber to the boiler.

8. The cleaning system of claim 1, wherein the expansion chamber has a larger internal volume than the clean chamber.

9. The cleaning system of claim 1, wherein the boiler includes a first drain line, the cleaning chamber includes a second drain line, and the expansion chamber includes a third drain line.

10. The cleaning system of claim 1, further comprising a viewport or camera coupled to the clean chamber to observe the at least one component.

11. The cleaning system of claim 1, wherein the one or more fixtures include one or more wall supports extending from sidewalls of the cleaning chamber.

12. The cleaning system of claim 3, wherein the metering valve is disposed downstream of the bypass line.

13. A cleaning system for cleaning components for use in substrate processing equipment, comprising: a liquid supply having a fluid disposed therein; a boiler coupled to the liquid supply via a supply valve and having a heater configured to heat the fluid supplied to the boiler; a clean chamber fluidly coupled to the boiler via a gas line and a process gas supply line coupled to the gas line via a three-way valve, wherein a filter is disposed in the gas line between the boiler and the clean chamber upstream from the three-way valve, wherein the clean chamber includes one or more fixtures in an interior volume therein for holding at least one component to be cleaned, and wherein the clean chamber includes a heater for heating the interior volume; and an expansion chamber fluidly coupled to the clean chamber via a release line for evacuating the clean chamber, wherein the release line includes a release valve to selectively open or close a flow path between the expansion chamber and the clean chamber, wherein a bypass line extends from the release line to the expansion chamber, and wherein the expansion chamber includes a chiller for cooling the expansion chamber and a vacuum port configured to couple the expansion chamber to a vacuum pump.

14. The cleaning system of claim 13, further comprising a liquid line that extends from the boiler to the clean chamber, and a return line that extends from the clean chamber to the boiler.

15. The cleaning system of claim 13, wherein the boiler includes a first drain line, the cleaning chamber includes a second drain line, and the expansion chamber includes a third drain line.

\* \* \* \* \*